(12) United States Patent
Sharma

(10) Patent No.: US 8,527,933 B2
(45) Date of Patent: Sep. 3, 2013

(54) LAYOUT TECHNIQUE FOR STRESS MANAGEMENT CELLS

(75) Inventor: Puneet Sharma, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/237,365

(22) Filed: Sep. 20, 2011

(65) Prior Publication Data

US 2013/0074026 A1 Mar. 21, 2013

(51) Int. Cl.
*G06F 17/50* (2006.01)
*G06F 9/455* (2006.01)

(52) U.S. Cl.
USPC ........... 716/132; 716/110; 716/111; 716/112; 716/113; 716/118; 716/119; 716/133; 716/134; 716/135; 716/139; 703/13; 703/14

(58) Field of Classification Search
USPC ......... 716/118–119, 132–135, 139, 110–113; 257/206, 255, 401; 703/13–14
See application file for complete search history.

(56) References Cited

U.S. PATENT DOCUMENTS

| | | | |
|---|---|---|---|
| 6,815,770 B1 | 11/2004 | Chien et al. | |
| 6,831,292 B2 | 12/2004 | Currie et al. | |
| 6,881,632 B2 | 4/2005 | Fitzgerald et al. | |
| 7,222,328 B2 * | 5/2007 | Hasumi et al. | 716/53 |
| 7,683,401 B2 | 3/2010 | Jung | |
| 7,770,145 B2 * | 8/2010 | Nakano et al. | 716/53 |
| 7,781,277 B2 | 8/2010 | Nguyen et al. | |
| 8,239,799 B2 * | 8/2012 | Riviere-Cazaux | 716/113 |
| 2005/0035369 A1 | 2/2005 | Lin et al. | |
| 2005/0116360 A1 | 6/2005 | Huang et al. | |
| 2005/0139872 A1 | 6/2005 | Chidambaram et al. | |
| 2006/0043500 A1 | 3/2006 | Chen et al. | |
| 2006/0102955 A1 | 5/2006 | Chen et al. | |
| 2006/0292783 A1 | 12/2006 | Lee et al. | |
| 2007/0202662 A1 | 8/2007 | Lin et al. | |
| 2009/0282380 A1 * | 11/2009 | Chadwick et al. | 716/9 |
| 2010/0257493 A1 * | 10/2010 | Agarwal et al. | 716/4 |

FOREIGN PATENT DOCUMENTS

| | | |
|---|---|---|
| CN | 1499634 A | 5/2004 |
| CN | 1627519 A | 6/2005 |
| CN | 1645625 A | 7/2005 |

OTHER PUBLICATIONS

Kahng et al., (Exploiting STI Stress for Performance, 2007, IEEE, pp. 83-90).*
Kahng, A. et al., "Exploiting STI Stress for Performance," Proceedings of the 2007 IEEE/ACM International Conference on Computer-aided Design, ISBN:1-4244-1382-6, 2007, pp. 83-90.
Irisawa, T. et al., "High Current Drive Uniaxially-Strained SGOI pMOSFETs Fabricated by Lateral Strain Relaxation Technique," 2005 Symposium on VLSI Technology Digest of Technical Papers, ISBN 4-900784-02-8, 2005, pp. 178-179.
PCT International Search Report mailed Feb. 27, 2008 for International Application No. PCT/US07/66436, 3 pages.

\* cited by examiner

*Primary Examiner* — Nghia Doan

(57) ABSTRACT

An integrated circuit device layout is created based on charge carrier mobility characteristics of the device's non-functional cells. The charge carrier mobility of the non-functional cells can alter behavioral characteristics such as the hold time, setup time, or leakage current of nearby functional logic cells. Accordingly, a layout tool creates the layout for the integrated circuit device by selecting and placing non-functional cells having different mobility so as to selectively alter the characteristics of nearby logic cells.

15 Claims, 8 Drawing Sheets

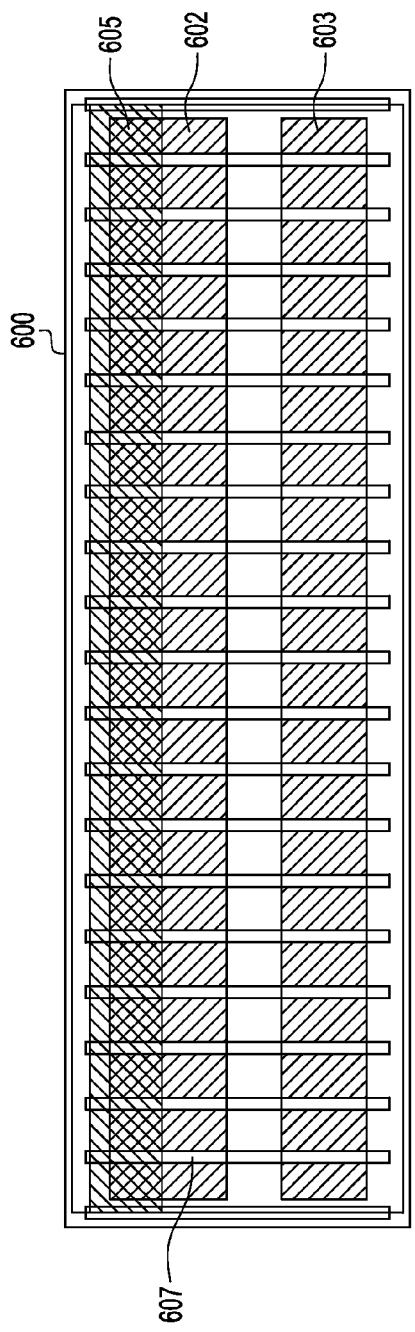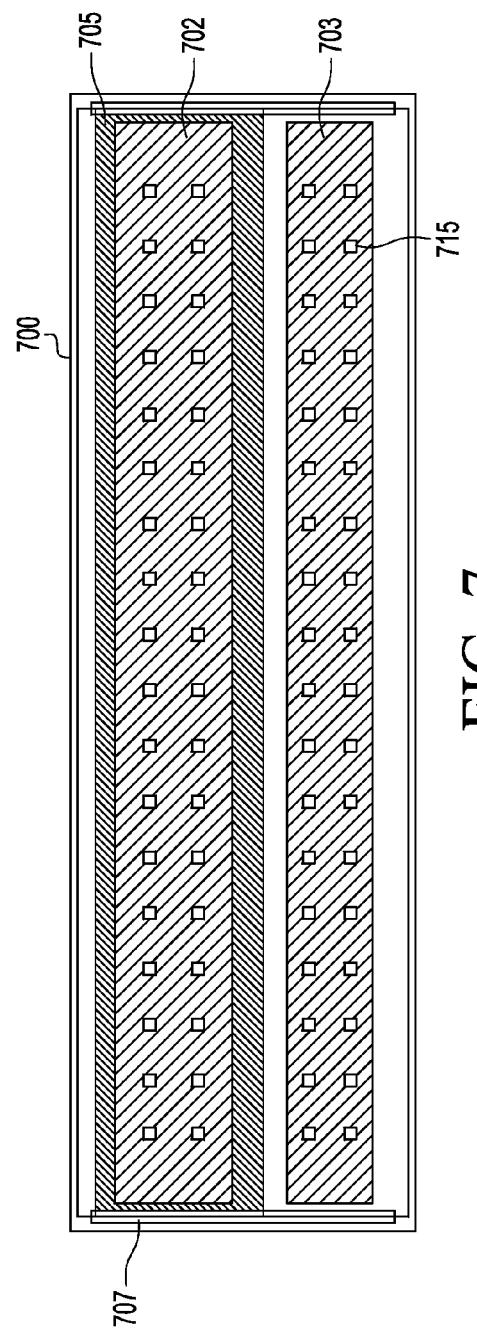
FIG. 6
FIG. 7

LAYOUT TECHNIQUE FOR STRESS MANAGEMENT CELLS

FIELD OF THE DISCLOSURE

The present disclosure relates to integrated circuit devices, and more particularly to layouts of integrated circuit devices.

BACKGROUND

An integrated circuit device may be created using an automated layout tool that places standard cells and their connections in an arrangement based on both the design of the integrated circuit device and specified layout rules. The resulting configuration of cells and connections is referred to as the device layout, and is used as a basis for forming the integrated circuit device.

BRIEF DESCRIPTION OF THE DRAWINGS

The present disclosure may be better understood, and its numerous features and advantages made apparent to those skilled in the art by referencing the accompanying drawings.

FIG. 6 is a block diagram of a non-functional cell in accordance with one embodiment of the present disclosure.

FIG. 7 is a block diagram of a non-functional cell in accordance with another embodiment of the present disclosure.

DETAILED DESCRIPTION

Figure 1:
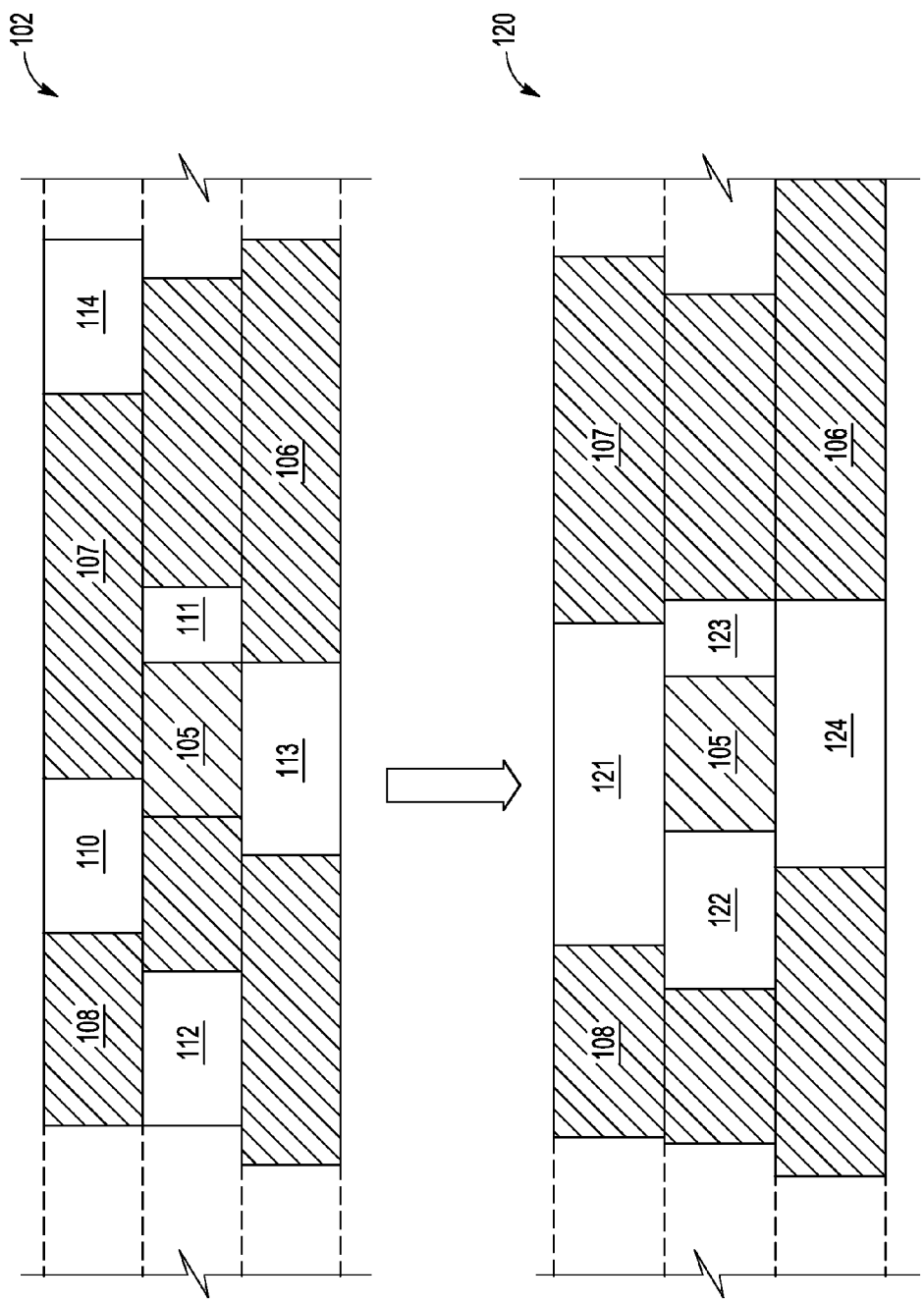
FIG. 1 is a block diagram illustrating the modification of an integrated circuit device layout in accordance with one embodiment of the present disclosure.

FIGS. 1-9 illustrate techniques for creating an integrated circuit device layout based on charge carrier mobility characteristics of the device's non-functional cells (cells which do not perform a designated logic operation for the integrated circuit device). The charge carrier mobility (generally referred to herein as mobility) refers to the speed at which charge carriers (electrons or holes) move in a material in a given direction in the presence of an applied electric field. The mobility of non-functional cells can alter behavioral characteristics such as the hold time, setup time, or leakage current of nearby functional logic cells (cells which perform one or more designated logical operations for the device). Accordingly, as described herein a layout tool can create the layout for an integrated circuit device by selecting and placing non-functional cells having different mobility so as to selectively alter the timing and leakage characteristics of nearby logic cells.

To illustrate, the effect of the mobility of a given non-functional cell on nearby functional cells depends on the process used to create the integrated circuit device. In particular, the design of a non-functional cell, including the amount of polysilicon, metal, contacts, and other features of the cell, can alter the mobility of the cell, resulting in a compressive or tensile effect on nearby logic cells. The compressive effect or tensile effect can, for example, improve the setup time of a nearby logic cell, improve the hold time of nearby logic cell, or improve the leakage current of a nearby logic cell, depending on the process used for the logic cell. Prior to layout, non-functional cells are designed so as to have particular effects on nearby logic cells. Thus, in selecting a non-functional cell for layout in an integrated circuit device design, the layout tool is able to select from a set of non-functional cells (referred to as a setup-time enhancing cells) that improve setup time of nearby logic cells and a set of non-functional cells (referred to as a hold-time enhancing cells) that improve the hold times of nearby logic cells. Depending on the process used to form the logic cells, the setup-time enhancing cells or the hold-time enhancing cells may also improve (e.g. reduce) the leakage current of nearby logic cells.

In operation, the layout tool arranges the cells of the integrated circuit device based on timing and leakage current measurements for the logic cells, so that non-functional cells are arranged to improve timing and leakage current of logic cells having a relatively larger impact on device performance. Thus, for example, setup-time enhancing cells are located near logic cells having higher setup-time criticality and hold-time enhancing cells are located near logic cells having higher hold-time criticality, as described further herein.

As used herein, a logic cell refers to a design cell having one or more devices that together perform one or more logical functions for an integrated circuit device. Accordingly, a logic cell can include transistors, logic gates, storage elements, memory devices, other logic modules, and the like, or any combination thereof. The hold time, setup time, and leakage current of a logic cell are examples of behavioral characteristics of the logic cell.

A non-functional cell as used herein refers to a cell that does not directly perform a logic function, such as a combinational logic function (e.g. a logic gate) or a logic storage function (e.g. a flip-flop) for the integrated circuit device that uses the non-functional cell. The non-functional cell can perform other functions, such as connecting power and ground rails or acting as charge storing cells to reduce voltage fluctuations at the integrated circuit device. The charge carrier mobility of a non-functional cell determines whether the non-functional cell is a setup-time enhancing cell, a hold-time enhancing cell, or a leakage current enhancing cell. The charge carrier mobility of a non-functional cell, and its associated impact on the timing and leakage current of nearby logic cells, is referred to as a mobility characteristic of the non-functional cell.

In addition, as used herein, hold-time criticality refers to whether the hold time of a logic cell is expected to cause an error in the behavior of the integrated circuit device if the device is operated at a designated clock frequency. In an embodiment, each logic cell in a device layout is characterized according to an amount of hold-time slack, whereby a positive value indicates that the hold-time of the logic cell is not expected to cause an error, and a negative value indicates the hold-time of the logic cell is expected to result in an error.

Further, higher magnitude negative values reflect the relative amount by which the hold-time needs to be adjusted to obviate the error. Accordingly, logic cells associated with higher magnitude negative values are referred to as more critical than logic cells associated with lower magnitude negative values.

As used herein, setup-time criticality refers to whether the setup time of a logic cell is expected to cause an error in the behavior of the integrated circuit device if the device is operated at a designated clock frequency. In an embodiment, each logic cell in a device layout is characterized according to an amount of setup-time slack, whereby a positive value indicates that the setup-time of the logic cell is not expected to cause an error, and a negative value indicates the setup-time of the logic cell is expected to result in an error. Further, higher magnitude negative values reflect the relative amount by which the setup-time needs to be adjusted to obviate the error.

FIG. 1 depicts a block diagram illustrating adjustment of an integrated circuit device layout based on timing margin or leakage current in accordance with one embodiment of the present disclosure. In particular, FIG. 1 illustrates a layout 102 including a set of logic cells, including logic cells 105-108, and non-functional cells 110-114. During design of the integrated circuit device, a layout tool can analyze the timing characteristics of the logic cells 105-108 and determine that logic cell 105 is, for example, a hold-time critical cell. In response, the layout tool can replace and rearrange the non-functional cells 110-114, and rearranging other functional and non-functional cells according, resulting in layout 120. As illustrated, layout 120 includes the logic cell 105 surrounded by non-functional cells 121-124. Each of the non-functional cells 121-124 have a different mobility than the non-functional cells 110-114, such that the non-functional cells 121-124 are hold-time enhancing cells relative to the non-functional cells 110-114. Accordingly, by replacing the non-functional cells 110-114 with hold time enhancing non-functional cells 121-124, and by placing the non-functional cells 121-124 in close proximity with the logic cell 105, the hold-time of the logic cell is improved, thereby reducing its hold-time criticality.

In another embodiment, the logic cell 105 is identified, based on the timing analysis, as a setup-time critical cell. In response, the layout tool replaces the non-functional cells 110-114 with new cells having different mobility characteristics such that the new cells are setup-time enhancing cells. That is, the new non-functional cells have a compressive or tensile effect on the functional cells so as to enhance the setup time margin for the functional cell. The layout tool surrounds the logic cell 105 with the setup time enhancing cells, similar to layout 120. This improves the setup-time of the logic cell 105 and reduces its setup-time criticality. In still another embodiment, the logic cell 105 is identified as having relatively high current leakage. In response, the layout tool replaces the non-functional cells 110-114 with the hold-time enhancing non-functional cells 121-124, and arranges the cells as illustrated by layout 120. This reduces the leakage current associated with the logic cell 105.

Figure 2:
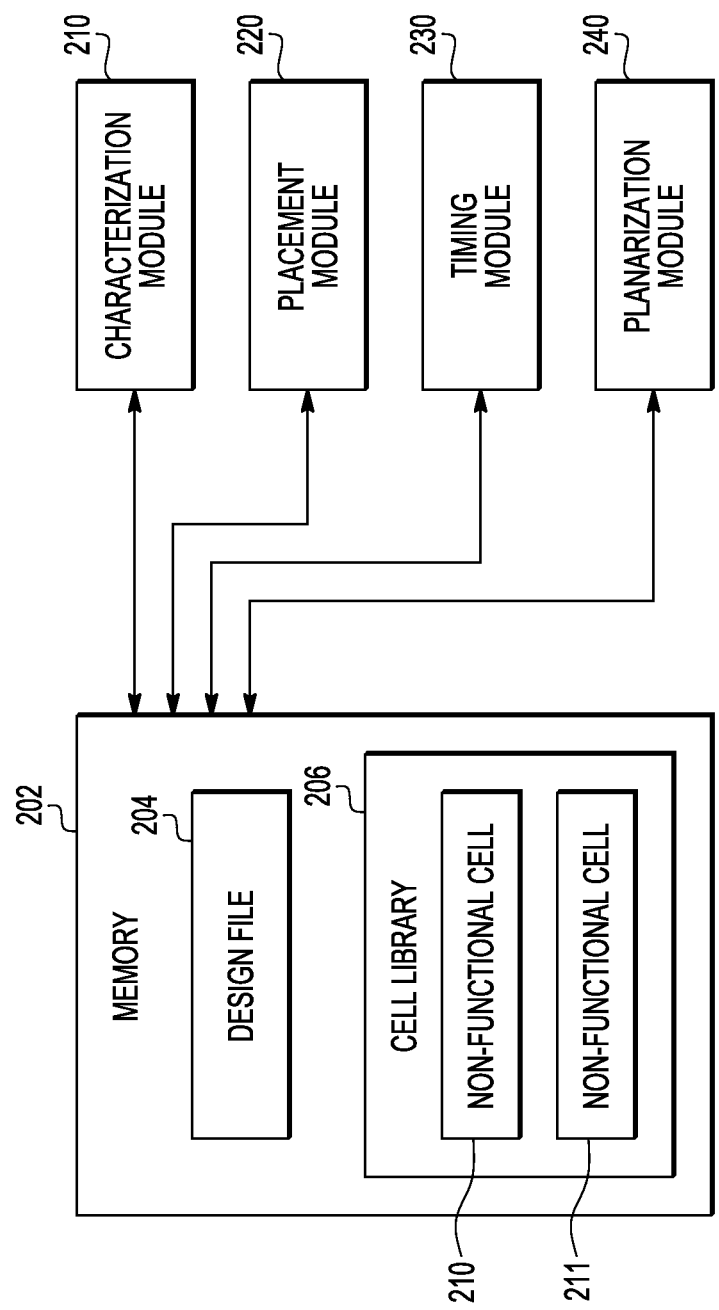
FIG. 2 is a block diagram of an integrated circuit device design system in accordance with one embodiment of the present disclosure.

FIG. 2 is a block diagram illustrating an integrated circuit device design system including computer-aided design (CAD) application modules in accordance with a specific embodiment of the present disclosure. Design system 200 is operable to facilitate the design of an integrated circuit, such as a data processing device. Design system 200 includes a memory 202, a characterization module 210, a placement module 220, a timing module 230, a planarization module 240, and a fill module 250. Memory 202 includes a design file 204 and a standard cell library 206.

The cell library 206 includes a plurality of predefined standard cells, including logic cells and non-functional cells, that can include logic devices and analog devices that are instantiated in a device design to implement an integrated circuit data processing device. A standard cell typically includes multiple models and views (viewpoints) that are provided to represent various aspects of the standard cell. For example, a standard cell can include a functional model that documents the logic operation performed by the standard cell, a timing model that provides signal propagation information for the standard cell, a circuit netlist that describes the transistor level connectivity of the standard cell, and physical views, such as a LEF view, that describes physical attributes of the standard cell such as the location of physical interface terminals. A device design stored at design file 204 is defined by a plurality of instantiations of standard cells from standard cell library 206 and information identifying the how the standard cell instances are interconnected. For example, a counter device can be implemented using one or more instantiations of a specific flip flop and combinatorial logic gates included at a standard cell library. The cell library includes non-functional cells 210 and 211, each having different charge carrier mobility than the other. Accordingly, in the example of FIG. 2 non-functional cell 210 is a hold-time enhancing, and leakage current reducing, cell, while non-functional cell 211 is a setup-time enhancing cell.

Design file 204 represents one or more databases used for storing a representation of a device design, such as a data processing device, and its associated attributes. Design file 204 is stored at memory 202 and can receive design information from design engineers and additional design properties and parameters from associated databases. In an embodiment, the design file 204 can represent a device using one or more models and views. For example, the device design can include a register-transfer level (RTL) model that provides a functional description of the device, a gate level representation of the device, and a transistor level representation of the device. Design file 204 can include additional device design attributes such as any information that a design engineer and the CAD application modules need to develop and model the device. When the design process is complete, the information stored at design file 204 can be used for production of the data processing device. For example, design file 204 can include a representation of a data processing device design that includes information relating to physical photo-mask features that are provided to an integrated circuit manufacturing facility.

Design system 200 includes application modules that are configured to manipulate device design information stored at the design file 204. To illustrate, characterization module 210 is operable to analyze the operation of a standard cell. In one implementation, characterization module 210 can analyze the operation of a standard cell based on a transistor-level netlist model of the standard cell to simulate the timing behavior of the standard cell and to determine a total sub-threshold leakage associated with the standard. For example, characterization module 210 can use transistor-level circuit modeling procedures to determine a set-up time of an input at the standard cell, a rate at which an output of the standard cell transitions based on a set of output loads, and other operational characteristics of the standard cell. In addition, characterization module 210 can determine transistor or standard cell leakage information based on model information or based upon a lookup table, that can associate leakage information with physical dimensions of a transistor, the name of the standard cell, or the like. Characterization module 210 can rank each standard cell based on a total amount of sub-threshold leakage of the cell based on the cumulative leakage of each included transistor. Results of the characterization procedure can be stored at standard cell library 206 at memory 202.

Placement module 220 is a layout tool operable to determine placement of each standard cell of a device design. Placement module 220 generally places standard cells in rows, each row typically having a consistent height corresponding to a respective height of a majority of the standard cells. Placement module 220 also can place non-functional cells adjacent to logic cells based on the setup-time criticality, hold-time criticality, or leakage current. The placement module 220 can also place non-functional cells for other purposes, such as for routing signal interconnects.

Timing module 230 is operable to determine the timing characteristics of a device design, including the timing behavior of each synchronous logic path included at the device design. The timing behavior of a logic path includes setup-time slack and hold-time slack. The timing information determined by timing module 230 can be used to further guide placement module 220 in determining the selection and location of each logic cell and non-functional cells of the device design to improve the timing performance of an associated logic path, as described further herein.

Planarization module 240 is operable to analyze physical features, such as diffusion areas, of a device design to determine the density of various regions of the device design. Based upon the analysis, the planarization module can identify, and provide density information, for localized portions of the device design that is used by fill module 250 to add fill regions to the device design to ensure proper planarization the manufacturing of the integrated circuit. For example, planarization module 240 can determine how many fill regions are to be placed at a portion of a device design based on an analysis of the layout density of active-layer features at the portion.

Therefore, the planarity of the integrated circuit following chemical-mechanical polishing can be improved by selectively controlling the uniformity and density of design features at the localized portions of the device design. For example, planarization module 240 can determine whether sufficient active-area is present at each localized portion of the device design. Information provided by planarization module 240 is generally expressed in the form of density ratios. For example, a selected localized portion of a device design may include an active-layer density of fifty percent. The density information provided by planarization module 250 can be compared to design guidelines to determine if sufficient active-layer is present in that localized portion of the device design, or whether additional fill regions should be added to each portion of the device design to satisfy the density ratio specified by the design guidelines.

Figure 3:
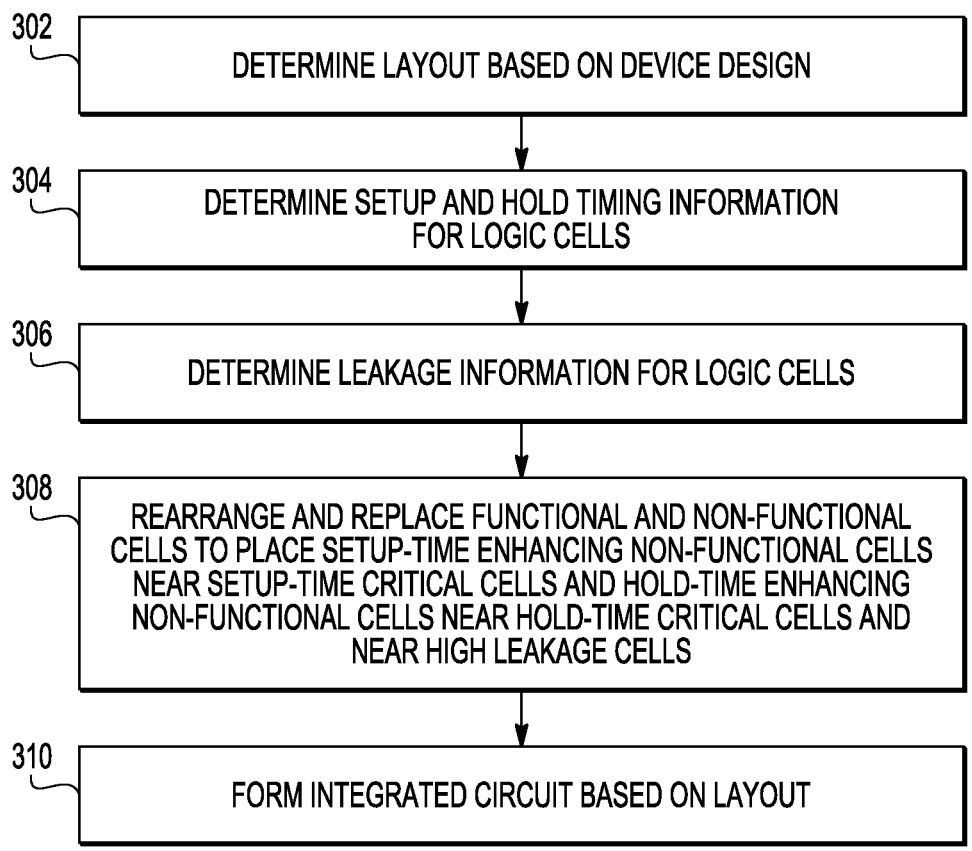
FIG. 3 is a flow diagram of a method of modifying an integrated circuit device layout in accordance with one embodiment of the present disclosure.

The operation of the design system 200 can be better understood with reference to FIG. 3, which illustrates a flow diagram of a method of determining an integrated circuit device layout in accordance with one embodiment of the present disclosure. At block 306, the placement module 220 determines an initial layout for the device design based on the design file 204 and the cell library 206. In particular, the placement module lays out each logic cell and non-functional cell of the device design as indicated by the design file 204. In an embodiment, the initial layout is determined based on a set of rules, referred to as layout rules, which set the parameters for the layout. For example, the layout rules can indicate the minimum distance between logic cells, limits on the proximity of particular cells or cell types, and the like. The placement module 220 can create the initial layout using the standard non-functional cell, thereby creating a baseline layout for subsequent modification.

At block 304, the timing module 230 determines the setup and hold time information for each logic cell of the initial layout. In an embodiment, the timing module 230 determines the information by determining the setup-time slack for each logic cell and the hold-time slack for each logic cell. The determination of setup and hold time for each cell can be made before or after initial placement and routing. The timing module 230 can create ordered lists of the logic cells according to the setup-time slack and hold-time slack respectively, in descending order of criticality. Thus, one list will set forth the logic cells in order of hold-time criticality and another list will set forth the logic cells in order of setup-time criticality.

At block 306 the characterization module 210 determines the leakage current for each logic cell in the initial device design and creates an ordered list of the cells based on the leakage current, with cells having higher leakage current ranked higher in the list. The determination of leakage current for each cell can be made before or after initial placement and routing. At block 308, the placement module 308 replaces and rearranges the functional and non-functional cells of the initial layout to place setup-time enhancing non-functional cells near setup-time critical cells and hold-time enhancing non-functional cells near hold-time critical cells and near high-current-leakage cells. At block 310, the modified layout is employed to form an integrated circuit device.

Figure 4:
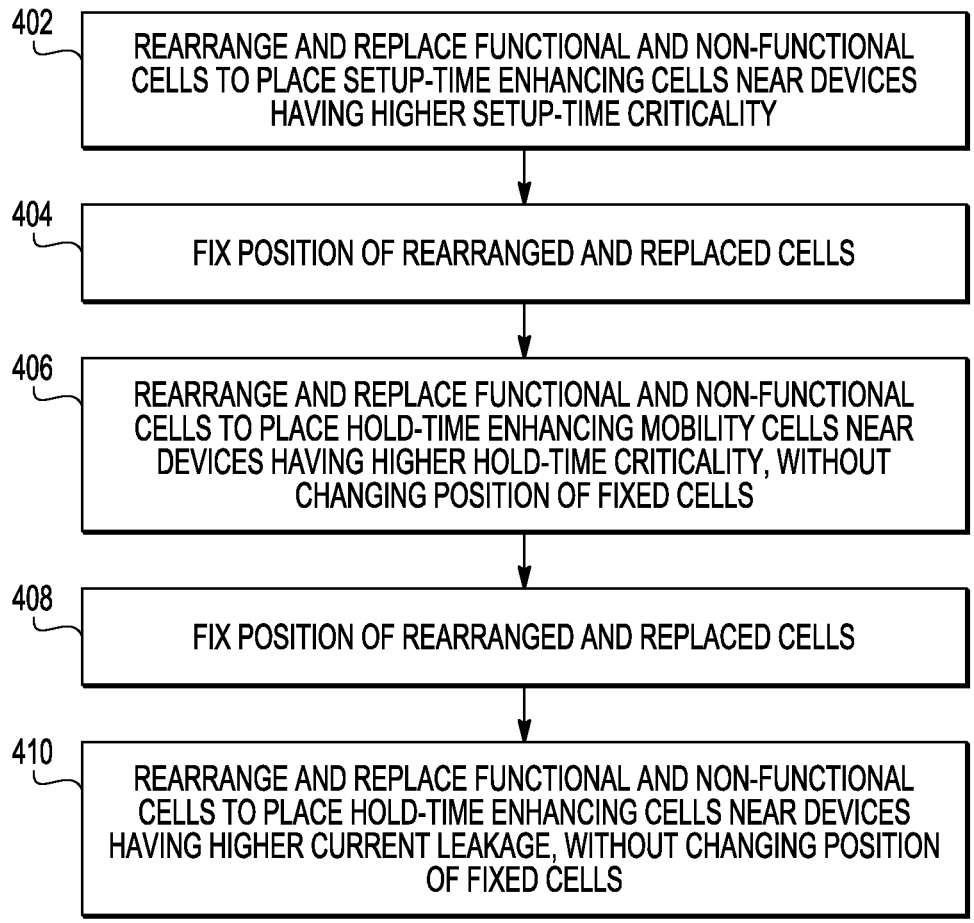
FIG. 4 is a flow diagram of a method of changing the placement of a cell in an integrated circuit device layout in accordance with one embodiment of the present disclosure.

FIG. 4 illustrates a flow diagram of a method of replacing and rearranging non-functional cells in accordance with one embodiment of the present disclosure. At block 402, the placement module 220 selects the setup-time enhancing non-functional cell from the cell library 206, selects a set of non-functional cells in the initial layout, replaces the selected set with the setup-time enhancing non-functional cell, and rearranges functional and non-functional cells to place the new non-functional cells in closer proximity to logic cells having higher setup-time criticality. In an embodiment, the placement module 220 proceeds through the logic cells in order of their setup-time criticality, and stops replacing and rearranging cells when such rearrangement would no longer reduce the setup time of a logic cell below that of the next-most-critical cell. At block 404, the placement module 220 fixes the position of any cells non-functional cells that were rearranged at block 402. The placement module 220 prevents these fixed cells from being moved in any subsequent rearrangement of the device layout.

At block 406, the placement module 220 selects the hold-time enhancing non-functional cell from the cell library 206, selects a set of non-functional cells in the initial layout, replaces the selected set with the hold-time enhancing non-functional cell, and rearranges functional and non-functional cells of the layout to place the new non-functional cells in closer proximity to logic cells having higher hold-time criticality. In an embodiment, the placement module 220 proceeds through the logic cells in order of their hold-time criticality, and stops replacing and rearranging cells when such rearrangement would no longer reduce the hold time of a logic cell below that of the next-most-critical cell. At block 408, the placement module 220 fixes the position of any cells non-functional cells that were rearranged at block 406.

At block 410, the placement module 220 selects a set of non-functional cells in the initial layout, replaces the selected set with the hold-time enhancing non-functional cell, and rearranges the functional and non-functional cells of the layout to place the new non-functional cells in closer proximity to logic cells having leakage current. In an embodiment, the placement module 220 proceeds through the logic cells in order of their leakage current magnitudes, and stops replacing and rearranging cells when such rearrangement would no longer reduce the leakage current of a logic cell below that of the next-most-critical cell.

Figure 5:
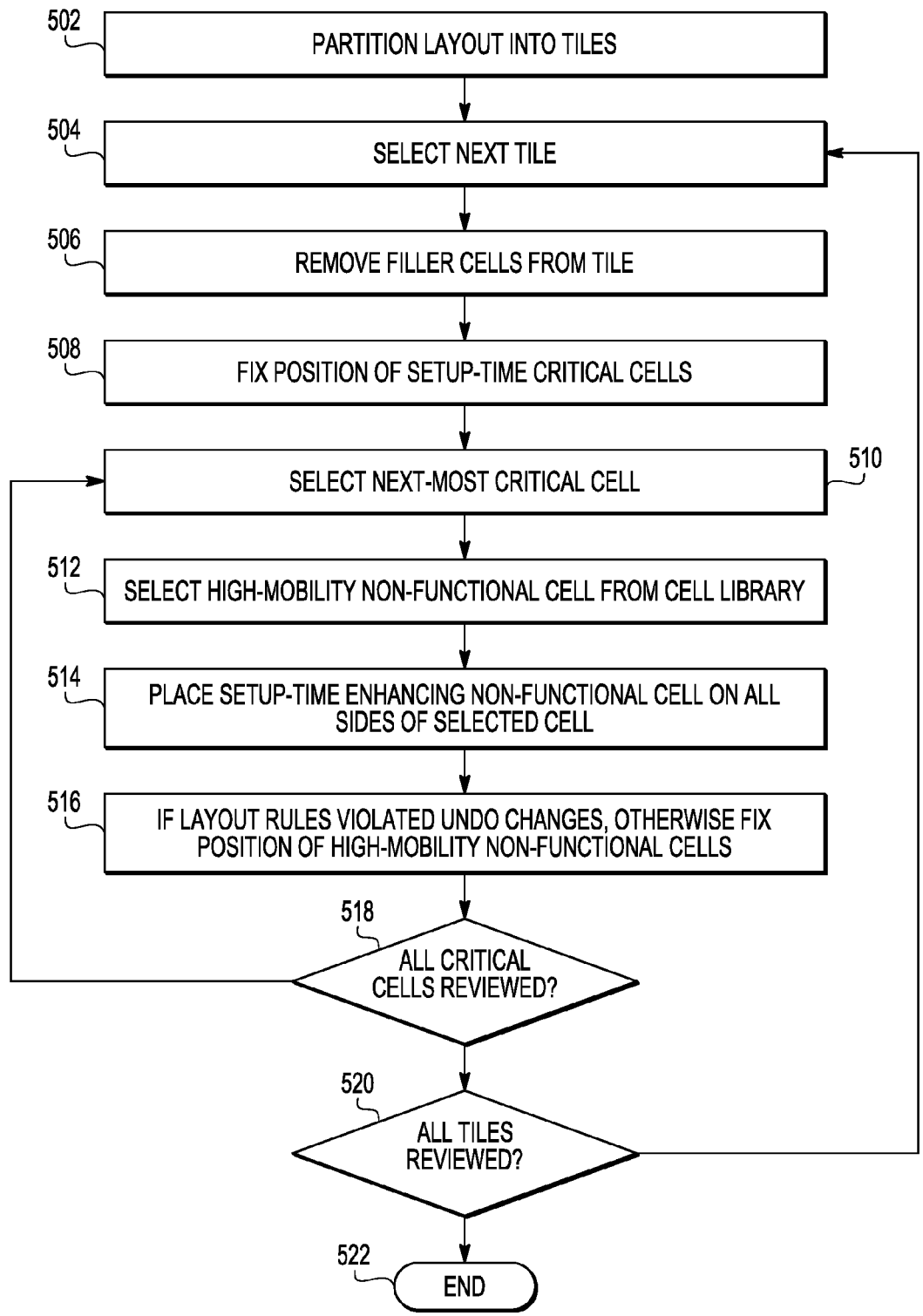
FIG. 5 is a flow diagram of a method of placing a non-functional cell based on the setup time of a logic cell in accordance with one embodiment of the present disclosure.

Replacement and rearrangement of non-functional cells based on setup-time criticality can be better understood with reference to FIG. 5, which illustrates a flow diagram of a method of modifying a layout based on setup-time criticality in accordance with one embodiment of the present disclosure. At block 502, the placement module 220 partitions the layout of the integrated circuit device into tiles, whereby each tile is a rectangular portion of the layout. Partitioning the device into tiles can reduce computational overhead, thereby allowing layout modification to take place in manageable segments. In another embodiment, the layout is analyzed as a whole and is not separated into tiles.

At block 504 the next tile to be analyzed is selected. At block 506, the placement module removes all non-functional cells from the selected tile. At block 508, the placement module determines which logic cells of the tile are setup-time critical logic cells and fixes their position. In an embodiment, the critical cells are determined based on the expected improvement in setup time for the cell in response to adjusting the layout to use setup-time enhancing non-functional cells. To illustrate, in an embodiment it is expected that replacing nominal non-functional cells with the setup-time enhancing non-functional cells, and rearranging those cells as described herein, will result in a 10 microsecond improvement in setup-time slack. It is further determined that the most critical cell in the initial layout has a setup-time slack of −15 microseconds. Therefore, replacing and rearranging non-functional cells is expected to reduce the of the setup-time slack for the most critical cell to −5 microseconds. Therefore, only those logic cells associated with a setup-time slack of less than −5 microseconds are determined to be in the set of setup-time critical logic cells. Note that, under this example, the most critical cell, while having its hold time improved, would still be expected to cause an error if the integrated circuit device were operated at the clock frequency that resulted in the indicated slack time. The expected error could be obviated by reducing the slack time further using other layout or design techniques, or by adjusting the clock frequency employed during operation of the integrated circuit device.

At block 510, the next-most critical logic cell in the set of setup-time critical logic cells is selected. At block 512, the placement module 220 selects the setup-time enhancing non-functional cell from the cell library 206. At block 514 the placement module 220 places instantiations of the selected setup-time enhancing non-functional cell on all sides of the selected logic cell, similar to the arrangement illustrated at layout 120 of FIG. 1. The placement module 220 also rearranges the placement of other logic cells in order to accommodate the newly-placed non-functional cells.

At block 516, the placement module 220 determines whether the layout rules have been violated by rearranging the logic cells to accommodate the rearranged non-functional cells. The layout rules can indicate a variety of limits, including limits on how far logic cells can be moved, whether logic cells can be moved from one row of cells to another, the proximity at which a logic cell can be placed relative to a layout boundary, how much a logic cell is permitted to overlap another logic cell, whether the order of the logic cells in a row can be changed, and the like. Thus, for example, in one embodiment the layout rules are violated if the placement of the setup-time enhancing non-functional cells causes any fixed cells to be moved, causes any non-fixed logic cell to be moved more than a specified amount, causes a logic cell to change its cell row, or causes the order of logic cells in a row to change. If the placement module 220 determines that a layout rule has been violated, the placement module undoes the changes to the layout made at block 514. If no layout rules have been violated, the placement module 220 fixes the position of the higher-mobility non-functional cells placed at block 514.

At block 518, the placement module 220 determines whether all the logic cells in the set of setup-time critical cells identified at block 508 have been reviewed. If not, the method flow returns to block 510 and the next-most critical logic cell is selected for review. If all the logic cells in the set have been reviewed the method flow moves to block 520 and the placement module 220 determines whether all tiles of the layout have been reviewed. If not, the method flow returns to block 504 and the next tile is selected. If all tiles have been reviewed, the method flow moves to block 522 and the placement module 220 ends modification of the non-functional cells based on setup time. The placement module 220 can then modify the layout based on hold time and leakage current in similar fashion to the method illustrated at FIG. 5, selecting and employing the hold-time enhancing non-functional cell.

FIG. 6 illustrates a non-functional cell 600 arranged as a hold-time enhancing cell for some process types. The hold-time enhancing cell 600 includes active regions 602 and 603, an n-well region 605, and polysilicon (poly) regions such as poly region 607. FIG. 7 illustrates a non-functional cell 700 arranged as a setup-time enhancing cell for the process types associated with non-functional cell 600. The setup-time enhancing cell 700 includes active regions 702 and 703, an n-well region 705, poly regions such as poly region 707, and a set of contacts such as contact 715. Accordingly, in the illustrated embodiments of FIGS. 6 and 7, the hold-time enhancing cell 600 has a relatively higher density of polysilicon, a relatively lower contact density, and a narrower n-well as compared to the setup-time enhancing cell 700.

Figure 8:
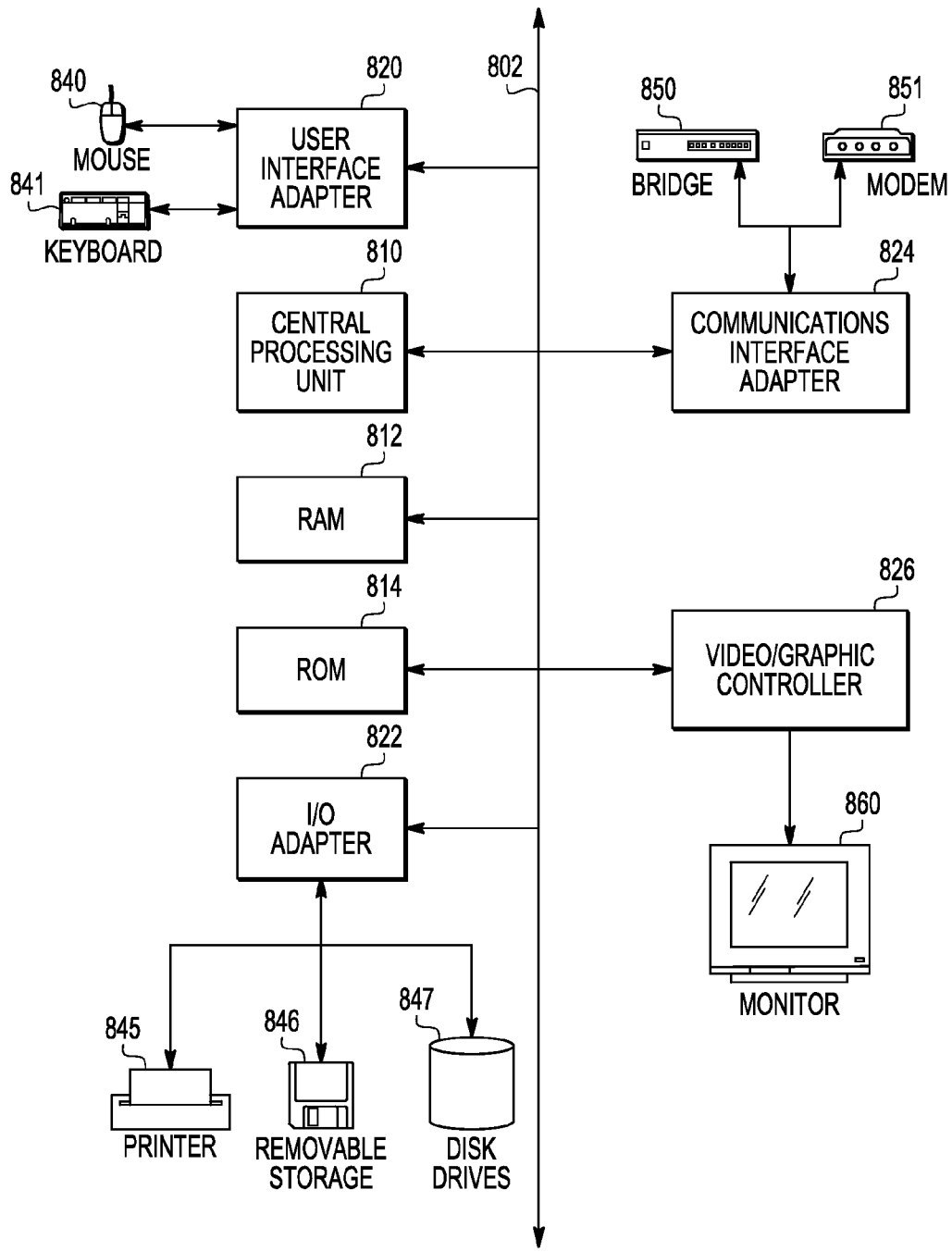
FIG. 8 is a block diagram illustrating a processing device in the form of a computer system 800 in accordance with a specific embodiment of the present disclosure.

FIG. 8 is a block diagram illustrating a processing device in the form of a computer system 800 in accordance with a specific embodiment of the present disclosure. Computer system 800 is illustrated to include devices connected to each other a central processing unit 810, which may be a conventional proprietary data processor, memory including a random access memory 812, a read only memory 814, and an input output adapter 822, a user interface adapter 820, a communications interface adapter 824, and a multimedia controller 826. Generally, system 800 will be capable of implementing the system and methods described herein. For example, design file 204 to be accessed and manipulated by the methods described herein can be stored at disk drive 847 or at memory 812 and accessed by CPU 810 in response to an instruction.

Input output (I/O) adapter 822 is further connected to, and controls, disk drives 847, printer 845, removable storage devices 846, as well as other standard and proprietary I/O devices. User interface adapter 820 can be considered a specialized I/O adapter. Adapter 820 is connected to a mouse 840, and a keyboard 841. In addition, user interface adapter 820 may be connected to other devices capable of providing various types of user control, such as touch screen devices. Communications interface adapter 824 is connected to a bridge 850 such as is associated with a local or a wide area network, and a modem 851. System bus 802 can be connected to various communication devices to access external information. Multimedia controller 826 will generally include a video graphics controller capable of displaying images upon the monitor 860, as well as providing audio to external components (not illustrated).

Figure 9:
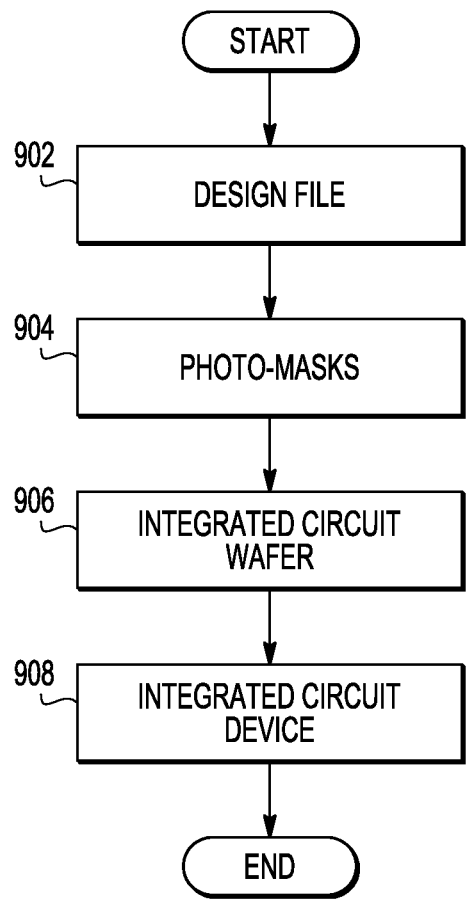
FIG. 9 is a flow diagram illustrating a method of forming an integrated circuit in accordance with a specific embodiment of the present disclosure.

FIG. 9 is a flow diagram illustrating a method of forming an integrated circuit in accordance with a specific embodiment of the present disclosure. At node 902 information included at a design file, such as design file 204, is provided to a photo-lithography facility. For example, design file 204 can include information representing the layout of the completed integrated circuit such as layout 120 of FIG. 1. The flow proceeds to node 904 where photo-masks are manufactured and provided to an integrated circuit wafer-fabrication facility. The flow proceeds to node 906 where an integrated circuit wafer is manufactured using the photo-masks. The flow proceeds to node 908 where integrated circuit devices are manufactured from integrated circuit die included at the integrated circuit wafer.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method of determining a layout of a data processing device, the method comprising:
    selecting, by a device design system, a first cell based on a charge carrier mobility of the first cell and a behavioral characteristic of a second cell; and
    placing, by the design system, the first cell in a relationship to the second cell of the data processing device, wherein in response to placing the first cell in the relationship with the second cell, the behavioral characteristic of the second cell is improved;
    wherein:
        placing the first cell further comprises placing a plurality of cells to surround the second cell, the plurality of cells comprising the first cell and a third cell having a common design with the first cell, wherein each of the plurality of cells having a different charge carrier mobility;
        the second cell comprises a logic cell; and
        the first cell and the third cell do not perform designated logic operations for the data processing device.

2. The method of claim 1, wherein the behavioral characteristic of the second cell is based on a setup time associated with the second cell.

3. The method of claim 1, wherein the behavioral characteristic of the second cell is based on a hold time associated with the second cell.

4. The method of claim 1, wherein the behavioral characteristic of the second cell is based on a leakage current associated with the second cell.

5. The method of claim 1, wherein the first cell and the third cell are non-functional cell variants.

6. The method of claim 5, wherein the non-functional cell variants have different densities of polysilicon.

7. The method of claim 5, wherein the non-functional cell variants have different n-channel widths.

8. The method of claim 5, wherein the non-functional cell variants have different numbers of contacts.

9. A method, comprising:
    selecting, by a device design system, a first non-functional cell from a plurality of non-functional cells based on a plurality of setup times and the plurality of hold times associated with a set of functional cells for an integrated circuit device, and upon a behavioral characteristic of a functional cell; and
    placing, by the device design system, the first non-functional cell at a device layout for the integrated circuit device based on the plurality of setup times and the plurality of hold times associated with the set of functional cells, wherein the placement of the first non-functional cell at the device layout is in a relationship to the functional cell such that the behavioral characteristic of the functional cell is improved;
    wherein:
        placing the first non-functional cell further comprises placing a plurality of non-functional cells to surround the functional cell, the plurality of non-functional cells comprising the first non-functional cell and a third non-functional cell having a common design with the first non-functional cell, wherein each of the plurality of non-functional cells having a different charge carrier mobility;
        the functional cell comprises a logic cell; and
        the first non-functional cell and the third non-functional cell do not perform designated logic operations for the data processing device.

10. The method of claim 9, further comprising:
    selecting a second non-functional cell from the plurality of non-functional cells based on the plurality of setup times and the plurality of hold times associated with the set of functional cells; and
    placing the second non-functional cell at the first device layout based on the plurality of setup times and the plurality of hold times associated with the set of functional cells.

11. The method of claim 10, wherein the first non-functional cell has a higher mobility than the second non-functional cell.

12. The method of claim 9, further comprising forming the integrated circuit device based on the device layout.

13. A non-transitory computer readable medium tangibly embodying a set of instructions to manipulate a processor to determine a layout of a data processing device design by:
    selecting a first cell based on a charge carrier mobility of the first cell and a behavioral characteristic of the second cell; and
    placing the first cell in a relationship to a second cell of the data processing device, wherein in response to placing the first cell in the relationship with the second cell, the behavioral characteristic of the second cell is improved;
    wherein:
        placing the first cell further comprises placing a plurality of cells to surround the second cell, the plurality of cells comprising the first cell and a third cell having a common design with the first cell, wherein each of the plurality of cells having a different charge carrier mobility;

the second cell comprises a logic cell; and
the first cell and the third cell do not perform designated logic operations for the data processing device.

14. The computer readable medium of claim 13, wherein the behavioral characteristic of the second cell is based on a setup time associated with the second cell.

15. The computer readable medium of claim 13, wherein the behavioral characteristic of the second cell is based on a hold time associated with the second cell.

* * * * *